(12) United States Patent
Shepherd, Jr. et al.

(10) Patent No.: US 7,017,514 B1
(45) Date of Patent: Mar. 28, 2006

(54) METHOD AND APPARATUS FOR PLASMA OPTIMIZATION IN WATER PROCESSING

(75) Inventors: Robert A. Shepherd, Jr., Castro Valley, CA (US); James Caughran, Lodi, CA (US)

(73) Assignee: Novellus Systems, Inc., San Jose, CA (US)

( * ) Notice: Subject to any disclaimer, the term of this patent is extended or adjusted under 35 U.S.C. 154(b) by 493 days.

(21) Appl. No.: 10/006,100

(22) Filed: Dec. 3, 2001

(51) Int. Cl.
*C23C 16/511* (2006.01)
*C23F 1/00* (2006.01)
*H01L 21/306* (2006.01)

(52) U.S. Cl. ............... 118/723 ME; 118/723 MW; 156/345.35; 156/345.36

(58) Field of Classification Search ............... 118/719, 118/723 E, 724, 723 ME, 723 ER, 723 IR, 118/723 MW; 156/345.34, 345.35, 345.36
See application file for complete search history.

(56) References Cited

U.S. PATENT DOCUMENTS

| | | | | |
|---|---|---|---|---|
| 2,245,145 A | * | 6/1941 | Hall et al. | 422/191 |
| 4,311,671 A | * | 1/1982 | Notman | 422/148 |
| 4,508,054 A | * | 4/1985 | Baumberger et al. | 118/718 |
| 4,761,269 A | * | 8/1988 | Conger et al. | 118/679 |
| 4,951,603 A | * | 8/1990 | Yoshino et al. | 118/719 |
| 4,979,465 A | * | 12/1990 | Yoshino et al. | 118/719 |
| 5,252,131 A | * | 10/1993 | Kiyama et al. | 118/719 |
| 5,354,412 A | * | 10/1994 | Suzuki et al. | 117/99 |
| 5,399,199 A | * | 3/1995 | Kiyama et al. | 118/719 |
| 5,480,678 A | * | 1/1996 | Rudolph et al. | 427/248.1 |
| 5,814,154 A | | 9/1998 | Boitnott | 118/723 R |
| 6,007,671 A | | 12/1999 | Fujimura et al. | 156/345.27 |
| 6,098,965 A | * | 8/2000 | Jacobs et al. | 261/114.2 |
| 6,123,775 A | * | 9/2000 | Hao et al. | 118/724 |
| 6,161,500 A | * | 12/2000 | Kopacz et al. | 118/723 E |
| 6,245,192 B1 | * | 6/2001 | Dhindsa et al. | 156/345.34 |
| 6,245,396 B1 | * | 6/2001 | Nogami | 427/562 |
| 6,432,831 B1 | * | 8/2002 | Dhindsa et al. | 438/710 |
| 6,521,858 B1 | * | 2/2003 | Barnett | 219/121.46 |

OTHER PUBLICATIONS

The Handbook of Fluid Dynamics—"Basic Engineering Fluid Mechanics", p. 5-62, Foss et al; 1998 CRC Press.*

* cited by examiner

Primary Examiner—Rudy Zervigon
(74) Attorney, Agent, or Firm—Martine Penilla & Gencarella, LLP

(57) ABSTRACT

An apparatus for managing plasma in wafer processing operations is disclosed which includes a housing having an internal region defined by an inner wall. The housing has an input port for supplying a plasma into the housing at a first end and an output port at a second end. The apparatus includes a hollow tube contained in the internal region within the housing. The hollow tube is defined by a wall that extends between the first end and the second end and contains a plurality of orifices generating a plurality of fluid paths through the wall. A fluid input is included supplying fluid into the internal region of the housing. The supplied fluid is capable of passing through the plurality of orifices, and the plasma supplied through the input port is capable of being mixed within the hollow tube with the supplied fluid. The output port at the second end of the housing enables the mixed plasma and fluid supply to exit the housing.

23 Claims, 6 Drawing Sheets

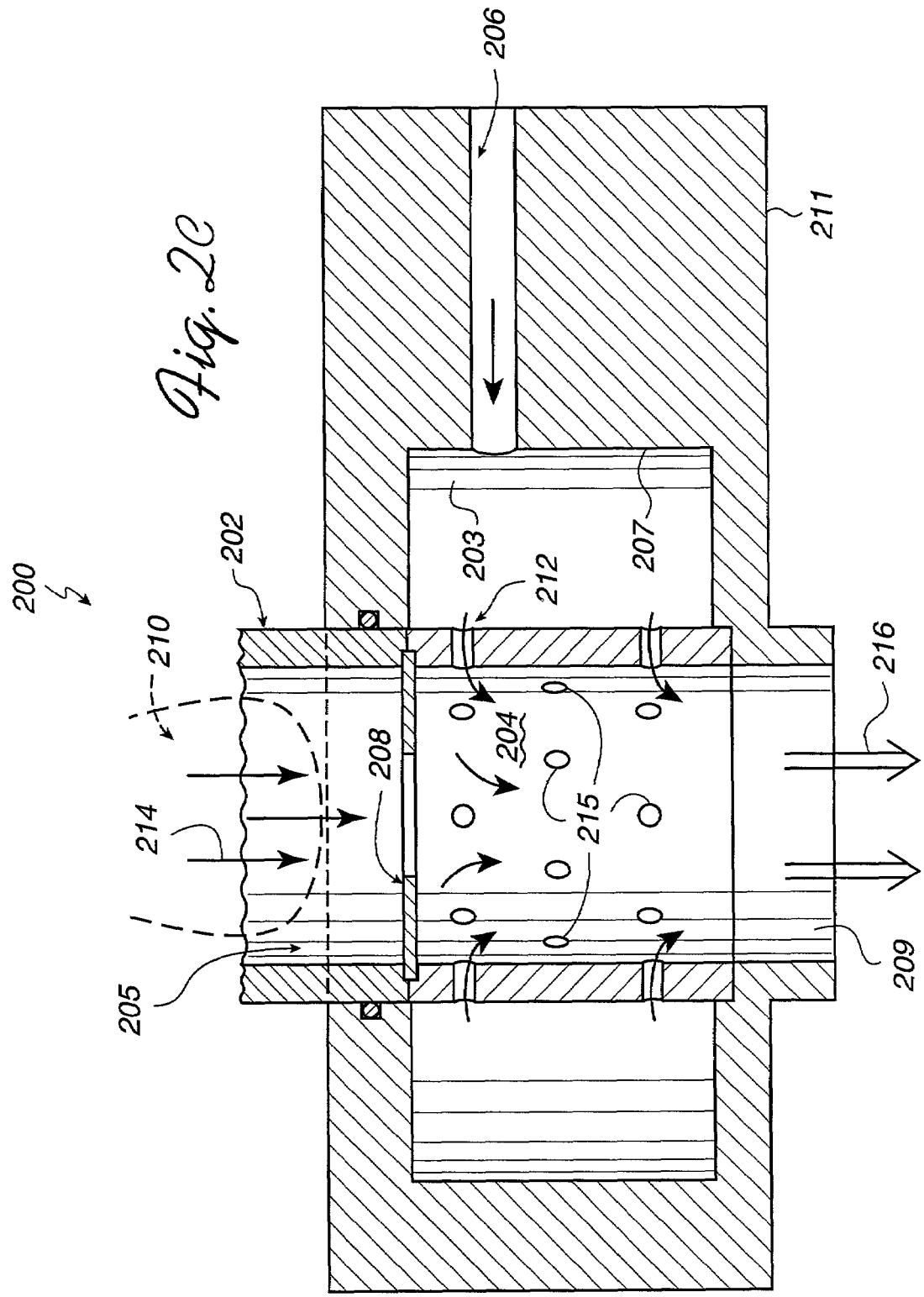

METHOD AND APPARATUS FOR PLASMA OPTIMIZATION IN WATER PROCESSING

BACKGROUND OF THE INVENTION

1. Field of the Invention

This invention relates generally to the field of semiconductor equipment and more particularly concerns optimal methods and apparatus for processing wafers with use of downstream plasma and gas injection.

2. Description of the Related Art

Downstream plasma processing systems are often used to process semiconductor wafers or substrates for fabrication of integrated circuits. For example, downstream plasma processes are commonly used in etching, photoresist removal, chemical vapor deposition (CVD), etc. The downstream plasma processes are typically carried out by systems that generally include a plasma processing chamber to provide a controlled setting.

The high temperatures produced within the plasma provide a source of convective heat transfer to the processing wafer. Subsequent heating of the wafer can produce wafer temperatures high enough to produce thermal damage to critical structures on the wafer, or detrimentally impacting the process, thus reducing device yield or requiring extensive further processing to remove the damage. Prior art equipment attempts to solve this problem by increasing the distance from the plasma source to the wafer using paths extended beyond ten inches.

The presence of electrons and ions that remain in the effluent gases which interact with the wafer surface can activate a mobile charge (Qm) on the surface of the wafer or induce damage to charge damage to underlying gate. Either of these effects may damage or destroy some or all of a device's structures before the it's fabrication can be completed. Long paths are sometimes used to minimize this effect.

Downstream injection has been used to improve downstream plasma processes by creating specific reactants which are capable of highly selective reactions. Specific examples are the addition of $Cl_2$ to a the effluent of a fluorine containing plasma (e.g. $NF_3$) to form ClF. The ClF is a highly selective etchant used for the highly selective removal of silicon nitride in the presence of silicon oxides. (J. Electrochem. Soc., (1989), 136, 2032) Most notably used for the removal of oxide isolation masks in LOCOS and PBLOCOS as well as in shallow trench isolation (STI) process flows.

A second example is removal of native silicon dioxide from silicon wafer surfaces prior to diffusion processes. (Jpn. J. Appl. Phys., (1994) 33, 2207.) In this case $NF_3$ is added downstream of Hydrogen plasma.

FIG. 1 shows one example of a downstream plasma source wafer processing apparatus 10. In this example, the apparatus 10 includes a microwave cavity 16 that is supplied with microwaves from a microwave supply source 18. The microwave cavity 16 is coupled with a tube 12 which has an input 14 where gas is typically injected. In such a configuration, gases such as hydrogen are generally injected into the tube 12 through the input 14. The gases are then energized to form downstream plasma by the microwaves in the microwave cavity 16. An input 22 leads into the tube 12. As the downstream plasma flows freely down the tube 12, $NF_3$ may be injected into the tube 12. During this lengthy straight-line travel without obstruction or interruption, the downstream plasma may become less reactive through recombination. Then the downstream plasma may serve to process a wafer 20 near an opposite end of the tube 12. Unfortunately, such a structure is generally large and the tube 12 is very long because the downstream plasma typically needs a long paths of travel distance for recombination to occur. Therefore, such structures can make wafer processing equipment large and space consuming. Unfortunately, in such a structure, it can be difficult to control and manage the types of downstream plasma species produced during the downstream plasma production and transportation process.

Another embodiment of a downstream plasma processing apparatus is shown by U.S. Pat. No. 5,814,154 entitled "Short-Coupled Path Extender for Plasma Source." This U.S. patent is hereby incorporated by reference.

If the types of species are not controlled properly, wafers may become damaged due to unforeseen reactions taking place on the wafer. In view of the above, an apparatus that utilizes gas injection in strategic locations to enable control of plasma species produced so wafer processing can be more uniform and controlled.

SUMMARY OF THE INVENTION

Broadly speaking, the present invention fills these needs by introducing gases at strategic locations within a downstream plasma optimization structure of the present invention thus providing for a method and apparatus of generating beneficial plasma species for a variety of user desires. It should be appreciated that the present invention can be implemented in numerous ways, including as a process, an apparatus, a system, computer readable media, or a device. Several inventive embodiments of the present invention are described below.

In one embodiment, an apparatus for managing plasma in wafer processing operations is disclosed which includes a housing having an internal region defined by an inner wall. The housing has an input port for supplying a plasma into the housing at a first end and an output port at a second end. The apparatus includes a hollow tube contained in the internal region within the housing. The hollow tube is defined by a wall that extends between the first end and the second end and contains a plurality of orifices generating a plurality of fluid paths through the wall. A fluid input is included supplying fluid into the internal region of the housing. The supplied fluid is capable of passing through the plurality of orifices, and the plasma supplied through the input port is capable of being mixed within the hollow tube with the supplied fluid. The output port at the second end of the housing enables the mixed plasma and fluid supply to exit the housing.

In another embodiment an apparatus is provided for recombining reactive plasma ions in wafer processing operations which includes a housing that has a fluid entry port and a fluid exit port. The housing has an internal region defined by a top horizontal wall, a bottom horizontal wall and a circular side wall. The apparatus also includes a plurality of baffle plates where each one of the plurality of baffle plates is a level in a multilevel structure formed in the internal region within the housing where each baffle plate is either separated from one another, or separated from either the top horizontal wall or the bottom horizontal wall by a separation spacing. Each of the plurality of baffle plates includes a plurality of holes where the plurality of holes in each of the baffle plates are oriented so that holes in each of the plurality of baffle plates are misaligned thus defining a nonlinear path for fluids designed to enter the entry port, traverse each level of the multilevel structure defined by the plurality of baffle plates, and leave the exit port of the housing. The apparatus also includes a gas inlet port in at least one of the separating spacing where the gas inlet port injects gas into the housing in at least one of the separation spacing.

In yet another embodiment, an apparatus for optimizing plasma management in wafer processing operations is disclosed. The apparatus has a housing configured to have a first chamber and a second chamber. The first chamber and the second chamber are separated by a wall having a plurality of orifices. The housing has an input port at a first end for supplying a plasma into the first chamber and an output port at a second end of the housing. The input port and the output port are aligned with each other, but misaligned with each of the plurality of orifices. At least one fluid input supplies fluid into at least one of the first chamber and the second chamber, the plasma supplied through the input port is capable of being mixed with the supplied fluid within the at least one of the first chamber and the second chamber. The output port at the second end enables the supplied plasma mixed with the fluid supply to exit the second chamber.

The advantages of the present invention are numerous. Most notably, through use of strategic gas injection to certain locations within the plasma optimization apparatus, specific plasma species may be generated in a controlled and optimal manner. The type of reactive species formed with the gas injection of the present invention may easily be controlled by controlling the ionic content of the plasma effluent prior to injection of the gas. In addition, because of the structures of the plasma optimization structure of the present invention, even more control plasma management may be utilized. Depending on the location of the gas injection as well as by varying the size of gas injection nozzles or by incorporating a manifold injection apparatus within the baffles, the present invention may control input of gases at various stages of plasma reactivity. As a result, the present invention enables usage of specific types of plasma effluent for optimal wafer processing.

In addition, the present invention has an ability to recombine ions and the use in a closed coupled plasma source where the plasma is not distantly remote from the injection port and reactor. The present invention enables downstream addition of reactant gases in a close coupled downstream plasma source. In addition, the prior art apparatus is extremely large, but the size of downstream optimization structure of the present invention may have a significantly smaller size and the ionic content can be controlled by either the location of the injection port or the size of the orifice or both as well as a simplified means of temperature control.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2C illustrates a plasma optimization structure that is manifold in accordance with one embodiment of the present invention.

DETAILED DESCRIPTION OF THE EXEMPLARY EMBODIMENTS

An invention is described for a method and apparatus for injecting gases in certain areas of a plasma optimization structure to enhance the flexibility of wafer processing during etching operations. It will be obvious, however, to one skilled in the art, that the present invention may be practiced without some or all of these specific details. In other instances, well known process operations have not been described in detail in order not to unnecessarily obscure the present invention.

Figure 1:
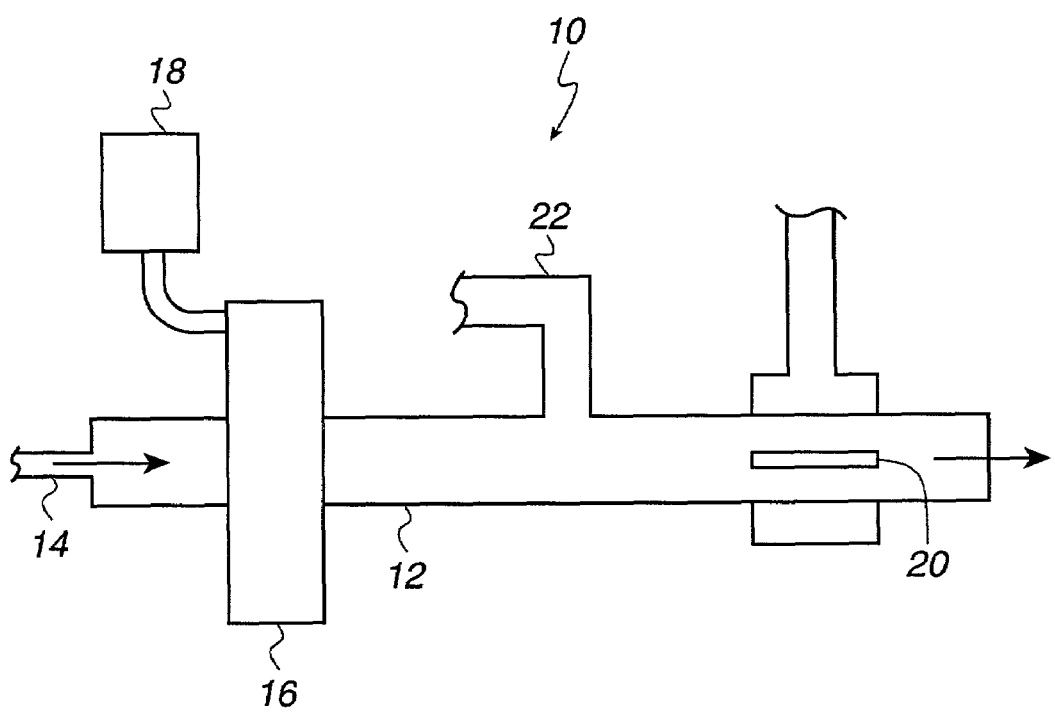
FIG. 1 illustrates a conventional plasma processing system for processing a wafer.
Figure 2A:
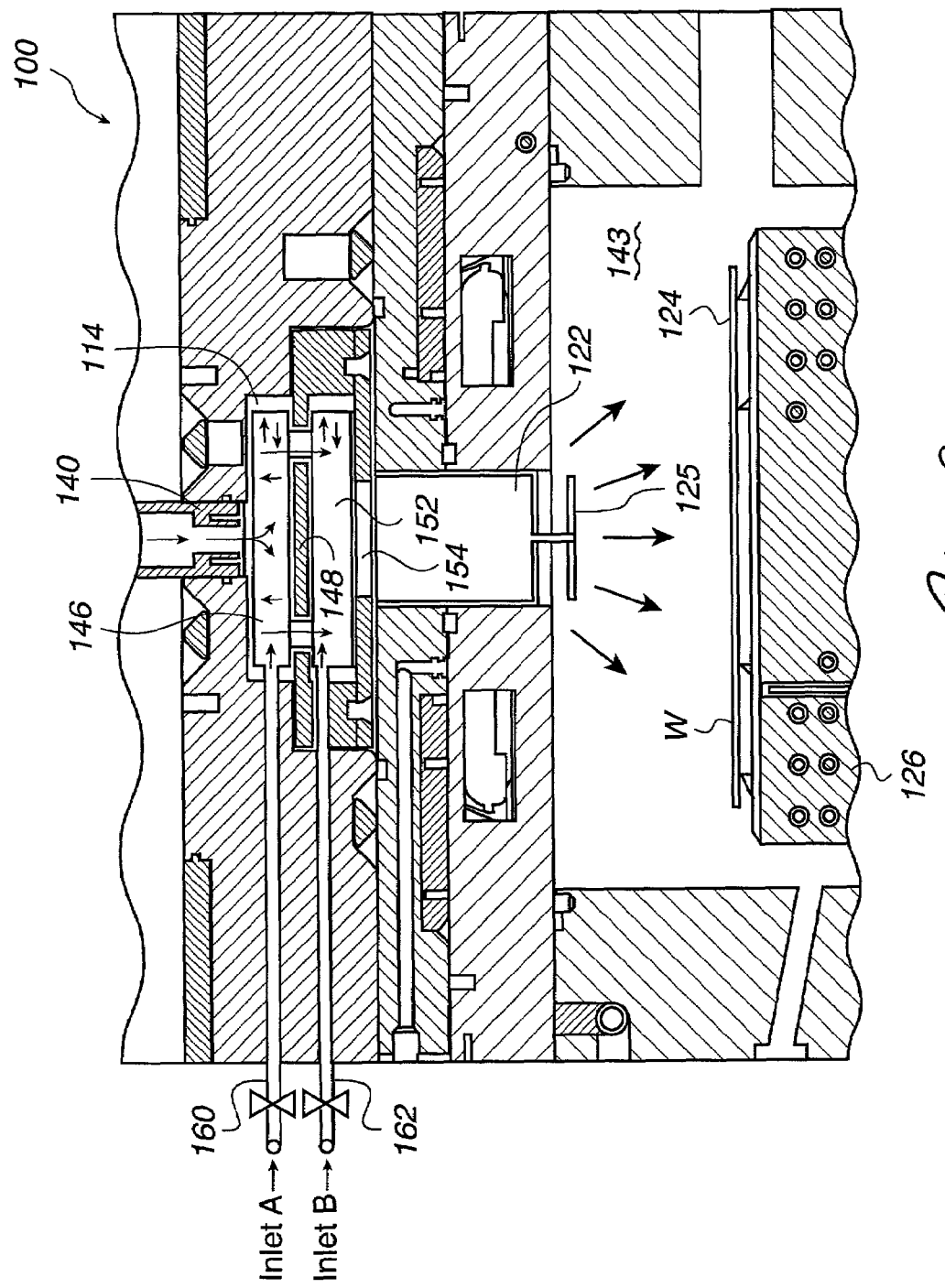
FIG. 2A is a simplified cross-sectional view of part of a Plasma Enhancement Platform (PEP) system that is modified to include a downstream plasma optimization structure with gas injection in accordance with one embodiment of the present invention.

FIG. 2A is a simplified cross-sectional view of part of a Plasma Enhancement Platform (PEP) system 100 that is configured to include a downstream plasma optimization structure 114 with gas injection in accordance with one embodiment of the present invention. The downstream plasma optimization structure 114 therefore may function as a SCOPE having improved advantages described herein. As is known to those skilled in the art, the PEP system include a microwave (MW) downstream plasma source.

As shown in FIG. 2A, the system 100 includes an input port 140 where downstream plasma may enter a downstream plasma optimization structure 114. In this embodiment, the downstream plasma optimization structure 114 has a first chamber 146 and a second chamber 152. Gas inlet port-A 160 may be connected to the first chamber 146 and a gas inlet port-B 162 may be connected to the second chamber 152. As explained below, downstream plasma (also may be known as a plasma effluent) can be inputted into the downstream plasma optimization structure 114 through an input port 140. Gas is injected in the first chamber 146 through the gas inlet port-A 160 for mixture with the plasma effluent from the first chamber 146. In one embodiment, the gas inlet port-A has a switch enabling gas input to be controlled. The plasma effluent may then enter the second chamber 152 where the plasma effluent can mix with gas injected from the gas inlet port-B 162. Gas input into the second chamber 152 from the gas inlet port-B 162 may also be controlled by a switch so gas input is managed to provide a favorable mixture of gas with the plasma effluent. The downstream plasma optimization structure 114 is discussed in further detail in reference to FIG. 2B. By use of the gas inlet ports 160 and 162, gases may be injected into either or both of the chambers 146 and 152 to enable optimal control of the types of plasma species produced. The control of the plasma species produced by the present invention can enable more consistent and uniform processing of wafers. The gas inlet ports 160 and 162 may also be a manifold type structure to farther control gas input into the chambers 146 and 152.

After passing through the downstream plasma optimization structure 114, the plasma effluent (or neutral reactive gases) and various gases can be delivered to the diffusion disk 125 in a semiconductor wafer processing chamber 143. In this embodiment, the downstream plasma optimization structure 114 is connected to a plasma processing diffusion disk 125 to help evenly disperse plasma over a wafer 124. A platen 126 is located below the wafer 124 to control the temperature of the wafer. The point of introduction of gases can impact the results on wafer processing since the presence of ions or the lack of ions governs the formation of different active species. Therefore, by use of the system 100, the downstream plasma may be managed intelligently, and, by specific use of the downstream plasma optimization structure 114 and gas injection, certain types downstream plasma species that may be needed for optimal wafer processing may be produced.

Figure 2B:
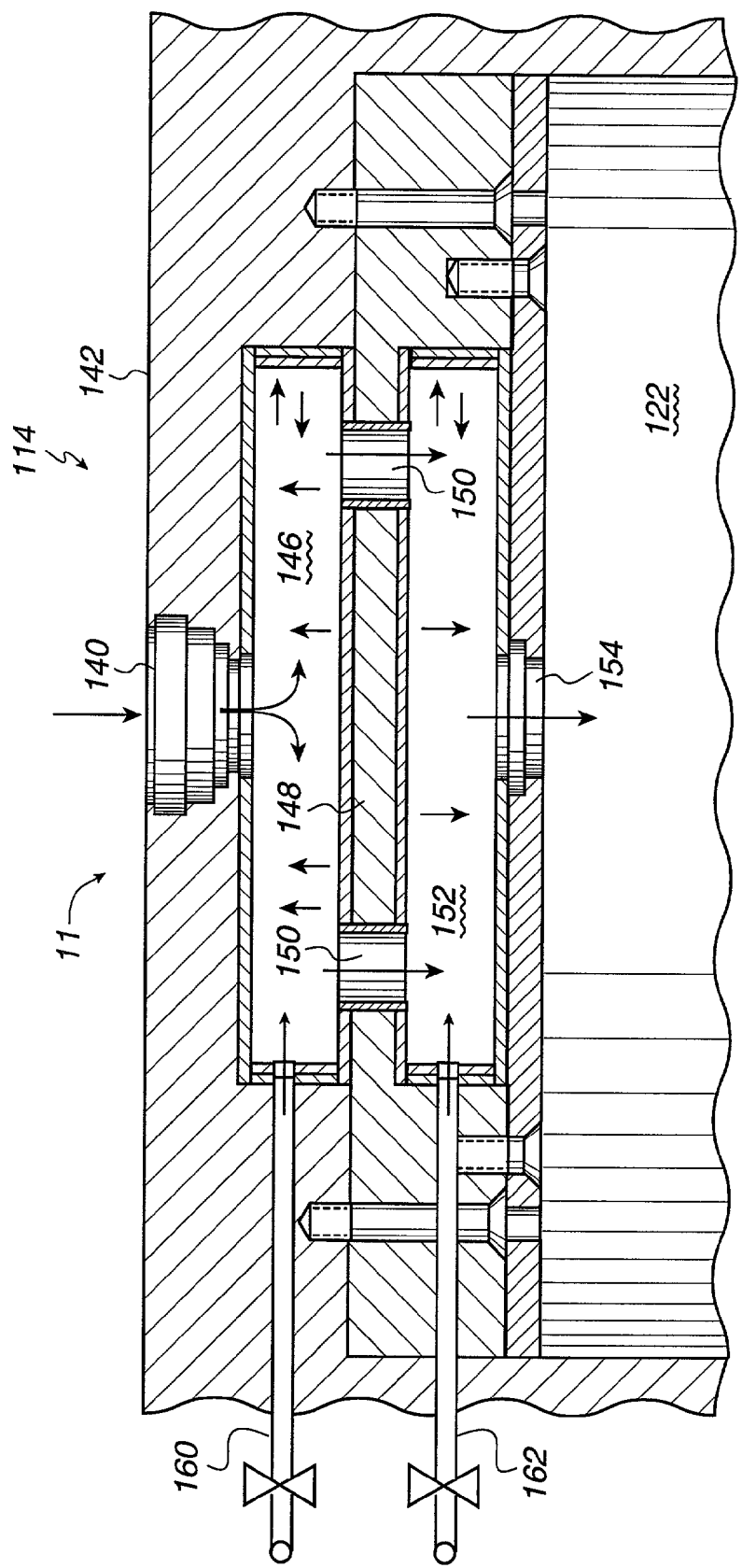
FIG. 2B illustrates a closer view of the plasma optimization structure with gas inlet ports in accordance with one embodiment of the present invention.

FIG. 2B illustrates a close-up view of the downstream plasma optimization structure 114 with gas inlet ports in accordance with one embodiment of the present invention. A housing 142 contains the downstream plasma optimization structure. A plasma source (not shown) connects with an input port 140 that leads to a first chamber 146. In one embodiment, a gas inlet port-A 160 may inject gas into the first chamber 146 for direct mixture with high energy downstream plasma ions. The downstream plasma in the first chamber 146 has many highly reactive ions because the plasma ions that have just entered the first chamber 146 have not had a chance to recombine. Therefore, certain downstream plasma species are formed that are not generally available with gas injection after plasma recombination. Consequently, this enables much greater flexibility in wafer processing than previously available because a wider array of downstream plasma may be utilized.

The downstream plasma flow, as it enters the first chamber 146, may mix with gases injected from the gas inlet port-A 160. Then the downstream plasma flow encounters a wall 148 at the back of the first chamber 146. After encountering the wall 148, the downstream plasma then makes a substantially 90 degree turn and is forced to flow radially outward to side walls of the first chamber 146. After hitting the side walls, the downstream plasma again makes a substantially 90 degree turn and heads toward a second chamber 152. By encountering the wall 148 and the side walls of the first chamber 146, the highly reactive plasma ions may recombine to leave less reactive downstream plasma ions. This enables the recombination of some of the most powerful plasma ions thereby reducing the amount of reactivity of downstream plasma ions before the time the downstream plasma enters into the second chamber 152.

The wall 148 has a plurality of orifices which, in one embodiment, is a system of outer ports 150. The downstream plasma then moves into the system of outer ports 150 that connects the first chamber 146 to the second chamber 152. The gas inlet port-A 160 and the gas inlet port-B 162 may also be known as fluid inputs. In one embodiment, a gas inlet port-B 162 is connected with the second chamber 152. The gas inlet port-B 162 may inject gases into the second chamber 152 to mix with the downstream plasma there. It should be understood that any type of gas may be utilized depending on the types of species desired in the wafer processing operation. In one embodiment, the gas utilized may be, for example, $Cl_2$, which is injected into the plasma effluent of an $NF_3$ plasma to form ClF (an etchant for selective etch of silicon nitride with respect to silicon oxide. In another embodiment, fluorine containing gas such as $NF_3$ may be injected downstream of a hydrogen containing plasma to remove various oxides with controlled selectivity. The downstream plasma in the second chamber 152 is typically less powerful and less reactive than the downstream plasma in the first chamber 146 because the highly reactive plasma ions in the first chamber 146 have had a chance to recombine. Consequently, the less powerful downstream plasma free radicals may then mix with the injected gas. Thus, the downstream plasma in the second chamber 152 may react differently with the injected gas than the more powerful downstream plasma (the most powerful downstream plasma may include, for example, higher concentration of ions, higher number of reactive ions, higher energy neutrals, etc.) in the first chamber 156. Consequently, different types of plasma species may be produced depending on the desires of the user. The downstream plasma then collects back together and exits the second chamber 152 through a central output port 154.

It should be appreciated that the size of the input ports may be varied to produce different types and amounts of plasma species depending on the desired type of wafer processing. The gas inlet port 160 and 162 may managed separately and may inject gas (or other types of fluids) individually or in combination.

FIG. 2C illustrates a downstream plasma optimization structure 200 that is a manifold in accordance with one embodiment of the present invention. In one embodiment, the present invention may inject gas into the plasma effluent and, as a result, even and thorough mixing of plasma effluent may occur in a condensed space prior to the presentation of the gases to the reaction chamber. The plasma optimization structure 200 may include a housing 211 with an input port 205. The input port 205 is connected to a perforated tube 204 positioned within a cavity 203 of the housing 211. The housing 211 also includes a gas injection port 206 (the side gas injection portion 206 may also be known as a fluid inlet) that can input fluid such as, for example, gas into the perforated tube 204. In one embodiment, the perforated tube 204 extends from a first end of the housing 211 to a second end of the housing 211. The cavity 203, which also may be described as an internal region, may be defined by an inner wall 207 that is, in one embodiment, circular. It should be appreciated that the inner wall 207 may be any configuration that would enable optimal gas input into the perforated tube 204. A space between the perforated tube 204 and the cavity 203 can act as a manifold for uniform and efficient injection of gas into a plasma effluent 210. The plasma optimization structure 200 may be located anyplace where gas is desired to be mixed with the plasma effluent 210. In one embodiment, the plasma optimization structure 200 may be located where the plasma optimization structure 114 is placed as shown in FIG. 2A.

Therefore, gas may be injected into an interior portion of the cylindrical perforated tube 204 to mix with the plasma effluent. In one embodiment, the gas utilized may be, for example, $Cl_2$, which is injected into the plasma effluent of an $NF_3$ to form ClF (an etchant for selective etch of silicon nitride with respect to silicon oxide). The gas may consequently mix with the plasma effluent within the tube 204. As gas is injected into the tube 204 from the port 206, plasma effluent that has already mixed with the gas is pushed out of the tube 204 through an output 209 as effluent 216. Such a configuration enhances gas and plasma turbulence within the tube 204 thereby enhancing mixing of the downstream plasma and the gas. It should be appreciated that any number, type, or size of perforations 215 may exist in the cylindrical perforated tube 204 as long as the configuration and number of perforations enable proper mixing of downstream plasma and gas depending on the type of wafer processing desired. The present invention can be used without or in conjunction with an orifice 208 at a base of the chamber 202. The size of the orifice 208 may be any size, and the size may be changed depending on the application involved. The perforated tube 204 may be constructed out of any type of material that is stable and does not react in a volatile manner with the downstream plasma and gases flowing through the system. For example, the perforated tube may be made out of, for example, teflon, quartz, sapphire, anodized aluminum, etc., or any other type of material that may be resistant to damage reactive gases that are formed. By use of a the plasma optimization structure 200, downstream plasma may be effectively mixed with gas to provide optimal plasma for whatever type of wafer processing operation desired.

Figure 3:
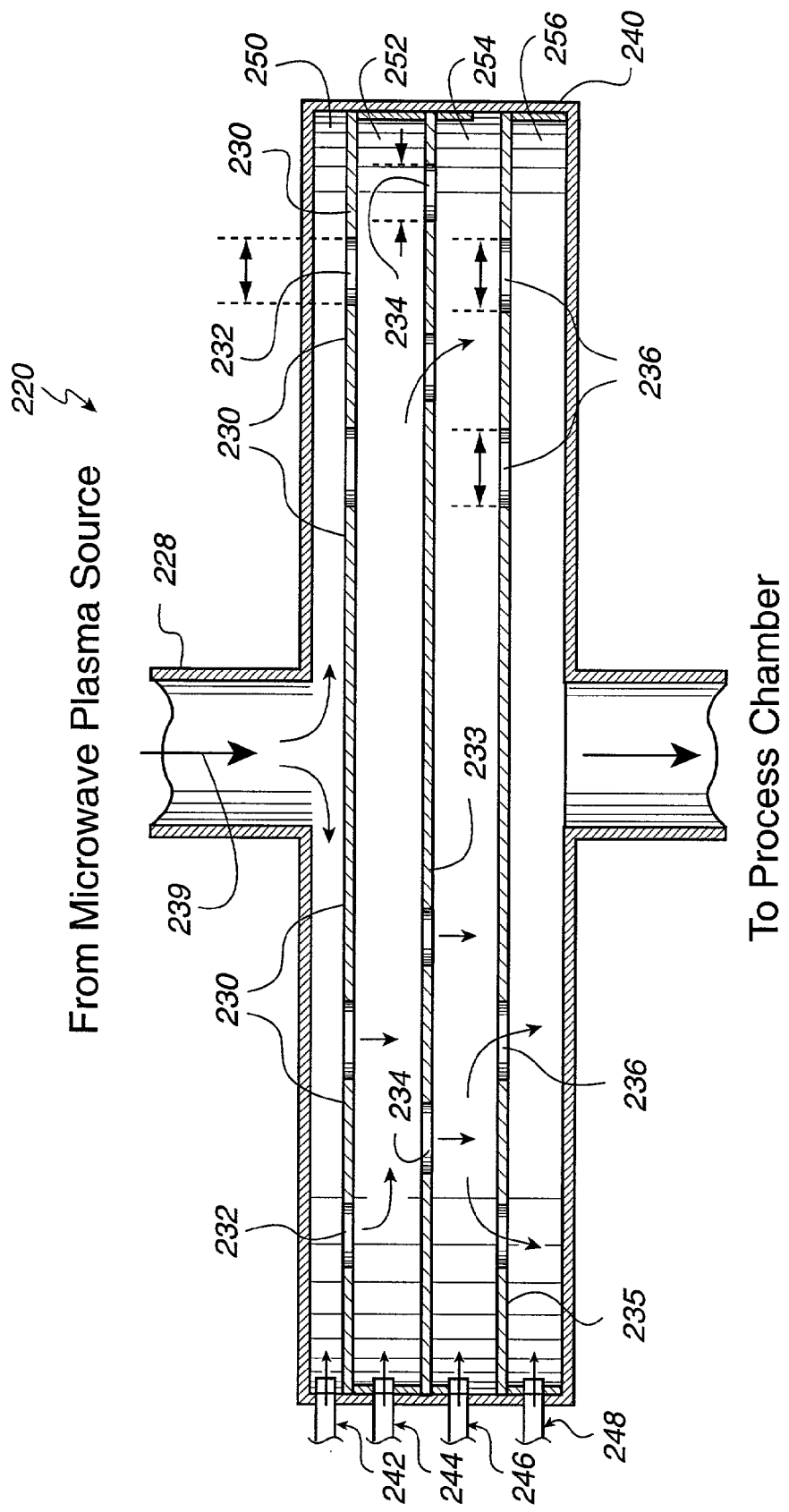
FIG. 3 shows the plasma optimization structure with baffle plates and gas inlet ports in accordance with one embodiment of the present invention.

FIG. 3 shows the downstream plasma optimization structure 220 with baffle plates in accordance with one embodiment of the present invention. It should be understood that the fluid flow through an input 228 may be modulated by placing multiple baffle plates with a pattern of misaligned holes at right angles to the direction of a flow 239. In one embodiment, the baffle plates may be circular plates with a plurality of holes. The baffle plates may be included in a chamber where the baffle plates define a multi-level structure. The multi-level structure may then have multiple levels of baffle plates with spaces between adjacent baffle plates.

The holes in the baffle plates are preferably misaligned (e.g., offset) with respect to one another in any desired configuration. In addition, it should be understood that any number of level or levels of the baffle plates may be utilized. It should also be understood that the baffle may be spaced apart by any amount of distance as long as the downstream plasma may fully mix with gas and enhance plasma ion recombination.

In one embodiment, as shown in FIG. 3, a first baffle plate 230, a second baffle plate 233, and a third baffle plate 235 are shown. In such an embodiment, a first plurality of holes 232 in the first baffle plate 230, a second plurality of holes 234 in the second baffle plate 233, and a third plurality of holes 236 in the third baffle plate 235 are misaligned. It should be understood that any given hole of the plurality of holes 232, 234, and 236 may be any size as long as proper turbulence may be generated that would result in mixing of gas and downstream plasma. The misaligned holes generate a substantial turn of the downstream plasma flow such as, for example, about a 90 degree turn, so mixing of downstream plasma and gas may occur. It should be understood that the baffle plates 230, 233, and 235 may be any size that enables inclusion of enough holes to allow plasma ion recombination and proper plasma and gas mixing.

In addition, the plurality of holes 232, 234, and 236 may be any size that would enable optimal plasma management. Each of the plurality of holes 232, 234, and 236 may also be different sizes and shapes from one another to optimize plasma ion recombination. In addition, multiple numbers of misaligned plates with an identical hole-pattern can be utilized to achieve the desired effects. It should also be understood that the baffle plates may be made out of any type of material that may facilitate plasma ion recombination such as, for example, sapphire, quartz, etc. The misaligned holes may offer impedance to the fluid flow, generate turbulence and increase the contact area. This may lead to rise in the pressure and ion recombination in upstream volume of a microwave plasma source.

In a preferred embodiment as shown in FIG. 3, one or more of the baffle plates 230, 233, and 235 of identical shape, size, and hole pattern can be placed substantially perpendicular to the gas flow. In this embodiment, there are no moving parts. Moreover, the configuration of the baffle plates 230, 233, and 235 also provides for the mixing length to enable the completion of chemical reaction between the excited species (radicals) in the plasma effluent and injected chemical species before the resultant gas mixture reaches the diffusion disk. Furthermore, by simply changing the height of a plurality of rings 240 (which, in one embodiment is made from sapphire) the number of baffle plates may be suitably increased or decreased. It should be understood that the plurality of rings 240 may be made out of any material that is resistant to damage from downstream plasma.

In the space between the baffle plates, gas inlet ports are utilized to inject gas into different levels of the plasma optimization structure 220. As indicated above, the downstream plasma, as it travels through the multiple levels of the plasma optimization structure, becomes less powerful due to the recombination of a portion of the highly reactive plasma ions. Consequently, the downstream plasma at a top level of the plasma optimization structure 220 is more powerful than the levels below it, and the power level of the plasma may be different at each level of the plasma optimization structure 220. Consequently, by enabling injection of gas into a particular level of the plasma optimization structure 220 or by enabling injection of gas into a combination of levels (or all levels) of the plasma optimization structure 220, various types of plasma species may be produced thus creating immense flexibility in wafer processing operations.

In one embodiment, a first gas inlet port 242 may provide gas to a first cavity section 250 above the baffle 230, a second gas inlet port 244 may provide gas to a second cavity section 252 above the baffle 233, a third inlet port 246 may provide gas to a third cavity section 254 above the baffle 235, and a fourth inlet port 248 may provide gas to a fourth cavity section 256 below the baffle 235. It should be understood that the present invention may have all, some, or just one of the gas inlet ports 242, 244, 246. It should also be understood that more or less baffles may be utilized within the plasma optimization structure where all, some, or one of the cavity sections generated by the baffles may have a gas inlet port.

Furthermore, the gas inlet ports may be of different sizes. By varying the physical characteristics of the gas injection ports, the amount and configuration of gas injection may also be varied thus giving more control to plasma species generation.

The plasma optimization structure 220 may be located anyplace where gas is desired to be mixed with downstream plasma. In one embodiment, the plasma optimization structure 220 may be located where the plasma optimization structure 114 is located as shown in FIG. 2A.

Figure 4:
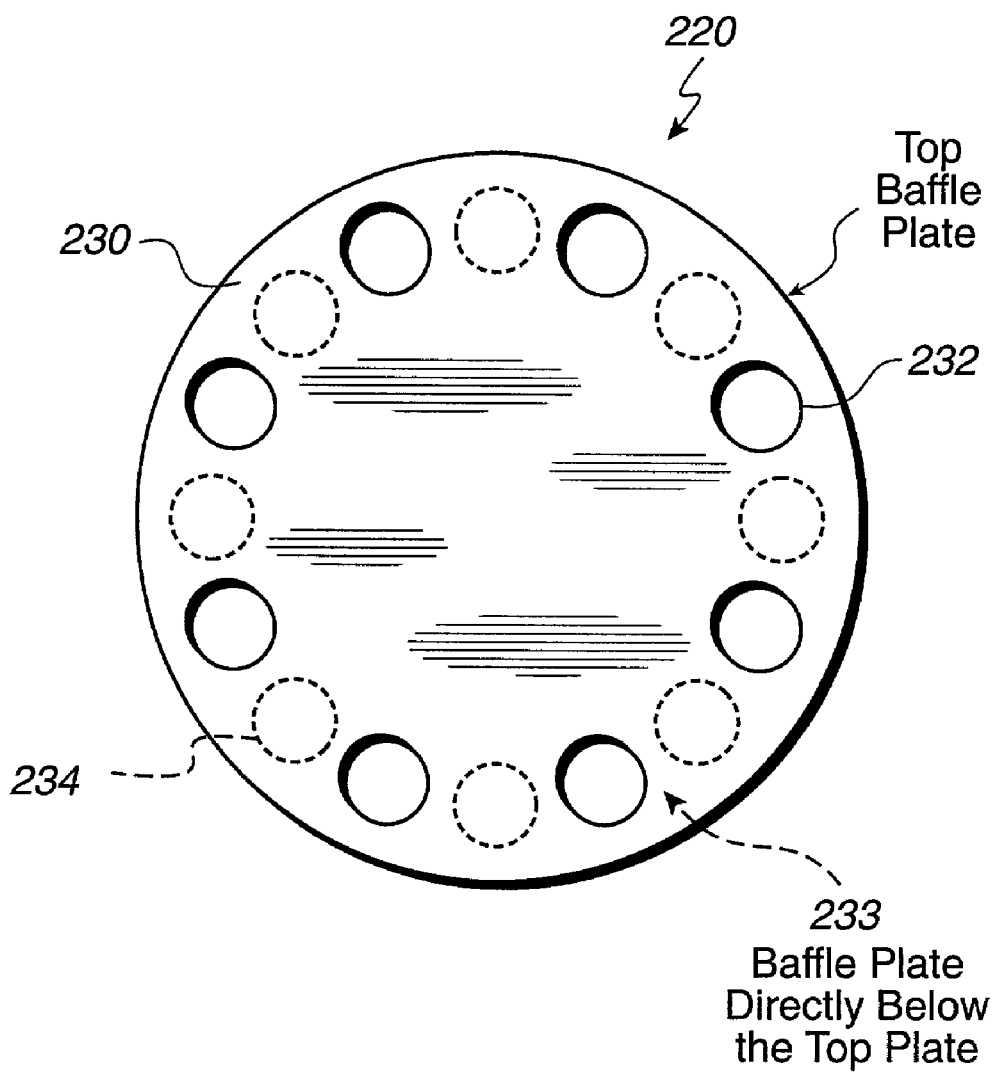
FIG. 4 shows a top view of the plasma optimization structure as shown in FIG. 3 in accordance with one embodiment of the present invention.

FIG. 4 shows a top view of the downstream plasma optimization structure 220 as shown in FIG. 3 in accordance with one embodiment of the present invention. The downstream plasma optimization structure 220 contains multiple levels (or layer) of baffle plates. From the top view, the first baffle plate 230 and the second baffle plate 233 are shown. In this view, the plurality of holes 232 and the plurality of holes 234 are seen as being misaligned so an indirect path exists for plasma moving through the downstream plasma optimization structure 220. As can be seen in the top view, the plurality of holes 234 are located on a level below the plurality of holes 232. In one embodiment the indirect path includes multiple 90 degree turns so high energy plasma ions may recombine. Therefore, by using baffle plates with the misaligned holes along with gas injection ports, plasma effluent may be managed in any number of ways to enable generation of favorable reactive species for the wafer processing operation desired.

In essence, the configurations described herein easily controls the type of reactive species formed by varying the location of gas injection in the downstream plasma flow path. It should be appreciated that in any of the embodiments described, the ionic content can also be further managed by varying the temperature of the downstream plasma processing. Moreover, the configurations described herein are flexible yet simple enough to reduce in to practice for rapid incorporation in the existing set of hardware.

Although the foregoing invention has been described in some detail for purposes of clarity of understanding, it will be apparent that certain changes and modifications may be practice within the scope of the appended claims. Accordingly, the present invention is to be considered as illustrative and not restrictive, and the invention is not to be limited to the details given herein, but may be modified within the scope and equivalence of the appended claims.

What is claimed is:

1. An apparatus for managing plasma in wafer processing operations, comprising:
   a housing having a fluid entry port and a fluid exit port, the housing having an internal region defined by a top horizontal wall, a bottom horizontal wall and a circular side wall;
   a plurality of baffle plates, each one of the plurality of baffle plates define a level in a multilevel structure formed in the internal region within the housing, each baffle plate being either separated from one another, or separated from either the top horizontal wall or the bottom horizontal wall by a separation spacing, each of the plurality of baffle plates including,
      a plurality of holes, the plurality of holes in each of the baffle plates being oriented so that holes defined in each of the plurality of baffle plates are misaligned, thus defining a nonlinear path for fluids designed to enter the entry port, traverse each level of the multilevel structure defined by the plurality of baffle plates, the fluids capable of mixing together at each level of the multilevel structure, and leave the exit port of the housing; and
   a gas inlet port in at least one of the separating spacing, the gas inlet port configured to inject gas into the housing in at least one of the separation spacing.

2. An apparatus for managing plasma in wafer processing operations as recited in claim 1, wherein the gas inlet port is in an uppermost separation spacing.

3. An apparatus for managing plasma in wafer processing operations as recited in claim 1, wherein the gas inlet port is in a lowermost separation spacing.

4. An apparatus for managing plasma in wafer processing operations as recited in claim 1, wherein gas injected from the gas inlet port mixes with the plasma in the separation spacing.

5. An apparatus for managing plasma in wafer processing operations as recited in claim 1, wherein the plasma and the gas flowing through the nonlinear path within the housing undergoes turbulence and mixes.

6. An apparatus for managing plasma in wafer processing operations as recited in claim 1, wherein the nonlinear path is designed to cause recombination in fluid gas traversing through the housing.

7. An apparatus for managing plasma in wafer processing operations as recited in claim 1, wherein each one of the plurality of baffle plates is circular.

8. An apparatus for managing plasma in wafer processing operations as recited in claim 1, wherein each one of the plurality of baffle plates is oriented horizontally in the housing.

9. An apparatus for managing plasma in wafer processing operations as recited in claim 1, wherein the plurality of baffle plates includes 3 baffle plates.

10. An apparatus for managing plasma in wafer processing operations as recited in claim 1, wherein each of the plurality of baffle plates provide a baffle surface area causing an increased impedance.

11. An apparatus for managing plasma in wafer processing operations as recited in claim 1, wherein the plasma is a downstream plasma.

12. An apparatus for optimizing plasma delivery in wafer processing operations comprising:
   a housing configured to have a first chamber and a second chamber, the first chamber and the second chamber being separated by a wall having a plurality of orifices, the housing having an input port at a first end for supplying a plasma into the first chamber and an output port at a second end of the housing, the input port and the output port being aligned with each other, but misaligned with each of the plurality of orifices; and
   at least one fluid input, the at least one fluid input being configured to supply fluid into at least one of the first chamber and the second chamber, the plasma supplied through the input port, the first chamber and the second chamber each capable of simultaneously mixing the fluid and the plasma;
   wherein the output port at the second end enables the supplied plasma mixed with the fluid supply to exit the second chamber.

13. An apparatus for optimizing plasma delivery in wafer processing operations as recited in claim 12, wherein the at least one fluid input is configured to supply fluid into the first chamber.

14. An apparatus for optimizing plasma delivery in wafer processing operations as recited in claim 12, wherein the at least one fluid input is configured to supply fluid into the second chamber.

15. An apparatus for optimizing plasma delivery in wafer processing operations as recited in claim 12, wherein a first fluid inlet is configured to supply fluid into the first chamber and a second fluid inlet is configured to supply fluid into the second chamber.

16. An apparatus for optimizing plasma delivery in wafer processing operations as recited in claim 15, wherein the first fluid inlet and the second fluid inlet are managed separately and may inject fluid individually or in combination.

17. An apparatus for optimizing plasma delivery in wafer processing operations as recited in claim 12, wherein the plasma is a downstream plasma.

18. An apparatus for managing plasma in wafer processing operations comprising:
   a housing configured to have an internal region that is defined by an inner wall, the housing having an input port for supplying a plasma into the housing at a first end and an output port at a second end;
   a hollow tube, the hollow tube being contained in the internal region within the housing, the hollow tube having a top and a bottom, the top connected to the first end and the bottom connected to the second end and further being defined by a wall that extends between the first end and the second end, the hollow tube containing a plurality of orifices that define a plurality of fluid paths through the wall; and a fluid input, the fluid input being configured to supply fluid into the internal region of the housing, the supplied fluid capable of passing through the plurality of orifices in the wall of the hollow tube, the plasma supplied through the input port capable of being mixed within the hollow tube with the supplied fluid that enters the hollow tube through the plurality of orifices;

wherein the output port at the second end of the housing enables the mixed plasma and fluid supply to exit the housing.

19. An apparatus for managing plasma in wafer processing operations as recited in claim 18, further comprising:

a plasma generating source connected to the input port, the plasma generating source configured to produce the plasma.

20. An apparatus for managing plasma in wafer processing operations as recited in claim 18, further comprising:

a wafer processing chamber connected to the output port, the wafer processing chamber being configured to receive the mixed plasma from the output.

21. An apparatus for managing plasma in wafer processing operations as recited in claim 18, wherein turbulence is created inside the hollow tube through receipt of the supplied fluid through the plurality of orifices.

22. An apparatus for managing plasma in wafer processing operations as recited in claim 21, wherein the turbulence ensures mixing of the supplied fluid and the plasma.

23. An apparatus for managing plasma in wafer processing operations as recited in claim 18, wherein the plasma is a downstream plasma.

* * * * *